US008713349B2

(12) United States Patent
Byeon et al.

(10) Patent No.: US 8,713,349 B2
(45) Date of Patent: Apr. 29, 2014

(54) SEMICONDUCTOR APPARATUS

(75) Inventors: Sang Jin Byeon, Ichon-si (KR); Jae Bum Ko, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 484 days.

(21) Appl. No.: 13/166,094

(22) Filed: Jun. 22, 2011

(65) Prior Publication Data
US 2012/0124408 A1    May 17, 2012

(30) Foreign Application Priority Data

Nov. 17, 2010   (KR) .................. 10-2010-0114408

(51) Int. Cl.
*G11C 5/06*    (2006.01)
(52) U.S. Cl.
USPC .......... 713/502; 365/63; 365/230.06; 327/77; 711/170
(58) Field of Classification Search
USPC .................. 713/502; 365/63, 230.06; 327/77; 711/170
See application file for complete search history.

(56) References Cited

U.S. PATENT DOCUMENTS

| 8,411,478 | B2* | 4/2013 | Yun et al. ............ 365/63 |
| 8,499,187 | B2* | 7/2013 | Kim et al. ........... 713/502 |
| 2012/0007624 | A1* | 1/2012 | Byeon et al. ......... 324/750.15 |
| 2012/0081984 | A1* | 4/2012 | Yun et al. ............ 365/203 |
| 2012/0173809 | A1* | 7/2012 | Ko ..................... 711/105 |
| 2012/0193806 | A1* | 8/2012 | Or-Bach et al. ....... 257/774 |

FOREIGN PATENT DOCUMENTS

KR    10-2009-0102809 A    9/2009

* cited by examiner

*Primary Examiner* — M Elamin
(74) *Attorney, Agent, or Firm* — William Park & Associates Patent Ltd.

(57) ABSTRACT

A semiconductor apparatus may comprise: a first chip ID generation unit configured to receive an enable signal through a first through-silicon via and a clock signal through a second through-silicon via and generate a first chip ID signal and a delayed enable signal; a second chip ID generation unit configured to receive the delayed enable signal through a third through-silicon via from the first chip ID generation unit and the clock signal and generate a second chip ID signal; a first chip selection signal generation unit configured to receive the first chip ID signal and a main ID signal and generate a first chip selection signal; and a second chip selection signal generation unit configured to receive the second chip ID signal and the main ID signal and generate a second chip selection signal.

34 Claims, 6 Drawing Sheets

SEMICONDUCTOR APPARATUS

CROSS-REFERENCE TO RELATED APPLICATION

The present application claims priority under 35 U.S.C. §119(a) to Korean Patent Application No. 10-2010-0114408, filed on Nov. 17, 2010, in the Korean Intellectual Property Office, which is incorporated herein by reference in its entirety as if set forth in full.

BACKGROUND

1. Technical Field

Various embodiments of the present invention relate to semiconductor apparatuses. In particular, certain embodiments relate to a semiconductor apparatus having a plurality of chips that performs efficient assignment of IDs to the plurality of chips.

2. Related Art

In order to improve the degree of integration in a semiconductor apparatus, a 3D (three-dimensional) semiconductor apparatus, in which a plurality of chips are stacked and packaged in a single package to increase the degree of integration, has been developed. Since the 3D semiconductor apparatus includes a plurality of chips therein, it is configured such that each chip can be distinguished by electric signals that enable the semiconductor apparatus to select a certain chip among the plurality of chips.

FIG. 1 is a view schematically illustrating the configuration of a related art semiconductor apparatus including a chip selection circuit. As can be seen from FIG. 1, three chips Chip1 to Chip3 constituting the semiconductor apparatus are stacked in a misaligned step-like shape. Each of the chips Chip1 to Chip3 respectively has chip selection pins Chip Selection Pin 1 and Chip Selection Pin 2 for receiving chip selection signals. Each of the chips Chip1 to Chip3 is respectively applied with two voltages VDD and VSS to the two chip selection pins Chip Selection Pin 1 and Chip Selection Pin 2. One of the three chips Chip1 to Chip3 may be selected based on the applied two voltages VDD and VSS applied. In the related art semiconductor apparatus, when two chip selection pins Chip Selection Pin 1 and Chip Selection Pin 2 are provided for each chip as described above, up to four chips may be selected.

However, since the chip selection pins should be additionally provided as described above in the related-art semiconductor apparatus, it is difficult to secure enough footage of the chips, and only a limited number of chips may be selected. Also, the semiconductor apparatus should be equipped with wires for connecting the voltages VDD and VSS with the chip selection pins Chip Selection Pin 1 and Chip Selection Pin 2, which makes the overall circuit wiring complicated. Further, since the chips should be stacked in a misaligned step-like shape, packaging the semiconductor apparatus is complex and difficult.

Recently a 3D semiconductor apparatus using through-silicon vias (TSVs) are being developed. The 3D semiconductor apparatus may include a plurality of chips. The plurality of chips may be electrically connected to one another through the TSVs. The semiconductor apparatus using the TSVs may be formed by stacking the chips of a same type or different types. In this regard, the semiconductor apparatus is typically formed by stacking at least one master chip and a plurality of slave chips having the same structure as the master chip. A master chip may have the same or a different structure as the slave chips.

FIG. 2 is a view schematically illustrating the structure of a semiconductor apparatus using TSVs. As shown in FIG. 2, a master chip and a plurality of slave chips may be electrically connected to one another through TSVs. The plurality of slave chips receive data signals in common which are transmitted from the master chip through the TSVs by receivers. The signals transmitted by transceivers from each slave chip are received by the master chip through the TSVs. For example, when a signal is transmitted through the TSVs, all the slave chips receive the signal, which triggers all the slave chips to operate. Accordingly, a method for selecting only a slave chip that is intended to operate is necessary. By designating a slave chip which is intended to operate, only the slave chip required to operate can receive the signal and operate, while all the slave chips receive the signal from the master chip in common.

SUMMARY

Accordingly, there is a need for an improved semiconductor apparatus that may obviate one or more of the above-mentioned problems or disadvantages. In particular, there is a need for an improved semiconductor apparatus capable of assigning IDs to a plurality of chips constituting a 3D semiconductor apparatus.

In the following description, certain aspects and embodiments will become evident. It should be understood that these aspects and embodiments are merely exemplary, and the invention, in its broadest sense, could be practiced without having one or more features of these aspects and embodiments.

In one exemplary aspect of the present invention, a semiconductor apparatus may comprise: a first chip ID generation unit configured to receive an enable signal through a first through-silicon via and a clock signal through a second through-silicon via and generate a first chip ID signal and a delayed enable signal; a second chip ID generation unit configured to receive the delayed enable signal through a third through-silicon via from the first chip ID generation unit and the clock signal and generate a second chip ID signal; a first chip selection signal generation unit configured to receive the first chip ID signal and a main ID signal and generate a first chip selection signal; and a second chip selection signal generation unit configured to receive the second chip ID signal and the main ID signal and generate a second chip selection signal.

In another exemplary aspect of the present invention, a semiconductor apparatus may comprise: a first chip ID generation unit configured to receive an enable signal through a first through-silicon via and a clock signal and generate a first chip ID signal and a converted enable signal; a second chip ID generation unit configured to receive the converted enable signal through a second through-silicon via and the clock signal and generate a second chip ID signal; a selection ID generation unit configured to provide one of the first chip ID signal and a first replacement ID signal as a first selection ID signal and provide one of the second chip ID signal and a second replacement ID signal as a second selection ID signal; and a chip selection signal generation unit configured to receive the first and second selection ID signals and a main ID signal and generate first and second chip selection signals.

In still another exemplary aspect of the present invention, a semiconductor apparatus having first and second chips stacked may comprise: a first set of through-silicon vias configured to pass through and connect the first and second chips while extending along one straight line, and transmit a signal generated from a circuit disposed in the first chip; a first redistribution layer configured to electrically connect the first set of through-silicon vias and a circuit disposed in the second chip; and a second redistribution layer configured to electrically connect the circuit disposed in the second chip and the first set of through-silicon vias.

In still another exemplary aspect of the present invention, a semiconductor apparatus with a plurality of chips may comprise: a first circuit module configured to receive a chip enable signal and a clock signal and generate a first identification signal indicative of a first code representing a first chip of the plurality of chips and a delayed enable signal, the delayed enable signal being obtained by delaying the enable signal based on the clock signal; a second circuit module configured to receive the delayed enable signal from the first circuit module and the clock signal and generate a second identification signal indicative of a second code representing a second chip of the plurality of chips; a first chip designation module configured to receive the first identification signal and a chip designation signal indicative of a target code representing a target chip to be activated among the plurality of chips including the first and second chips, and compare the first code with the target code to generate a first chip selection signal based thereon; and a second chip designation module configured to receive the second identification signal indicative of a second code representing the second chip and the chip designation signal, and compare the second code with the target code to generate a second chip selection signal based thereon.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
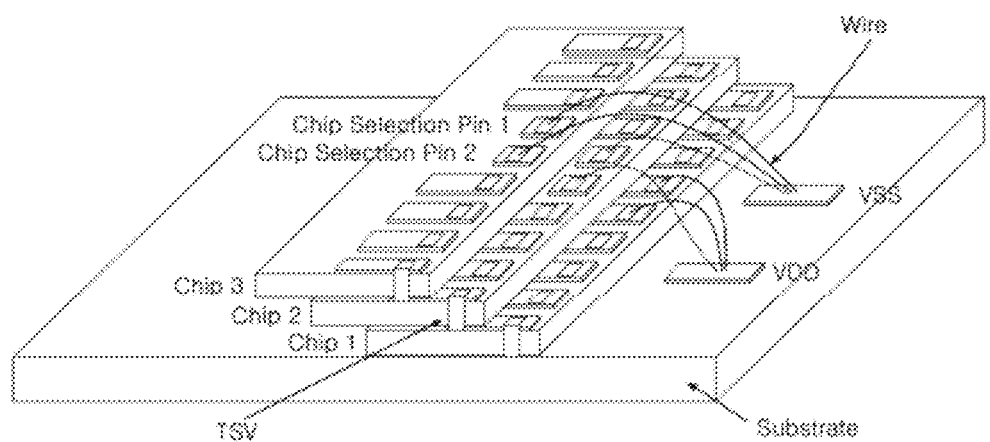
FIG. 1 is a view schematically illustrating the configuration of a related-art semiconductor apparatus.
Figure 2:
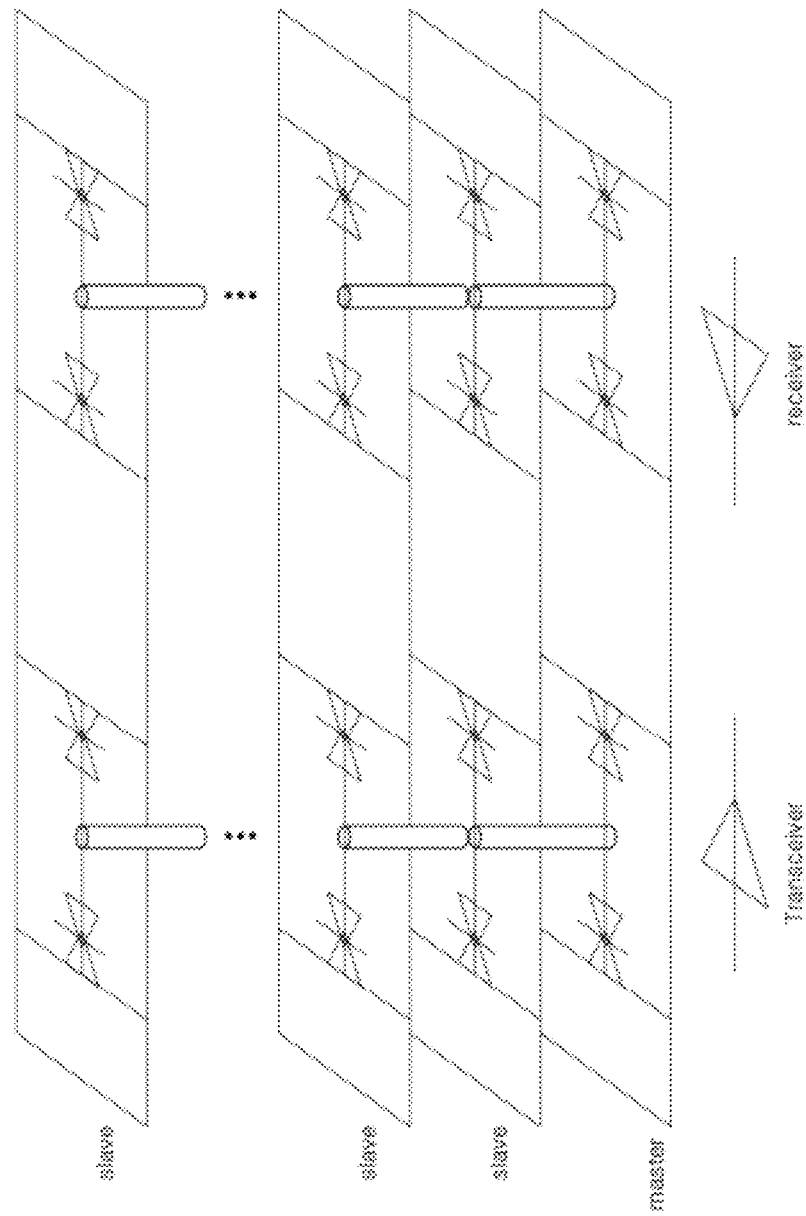
FIG. 2 is a view schematically illustrating the structure of a semiconductor apparatus using TSVs.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
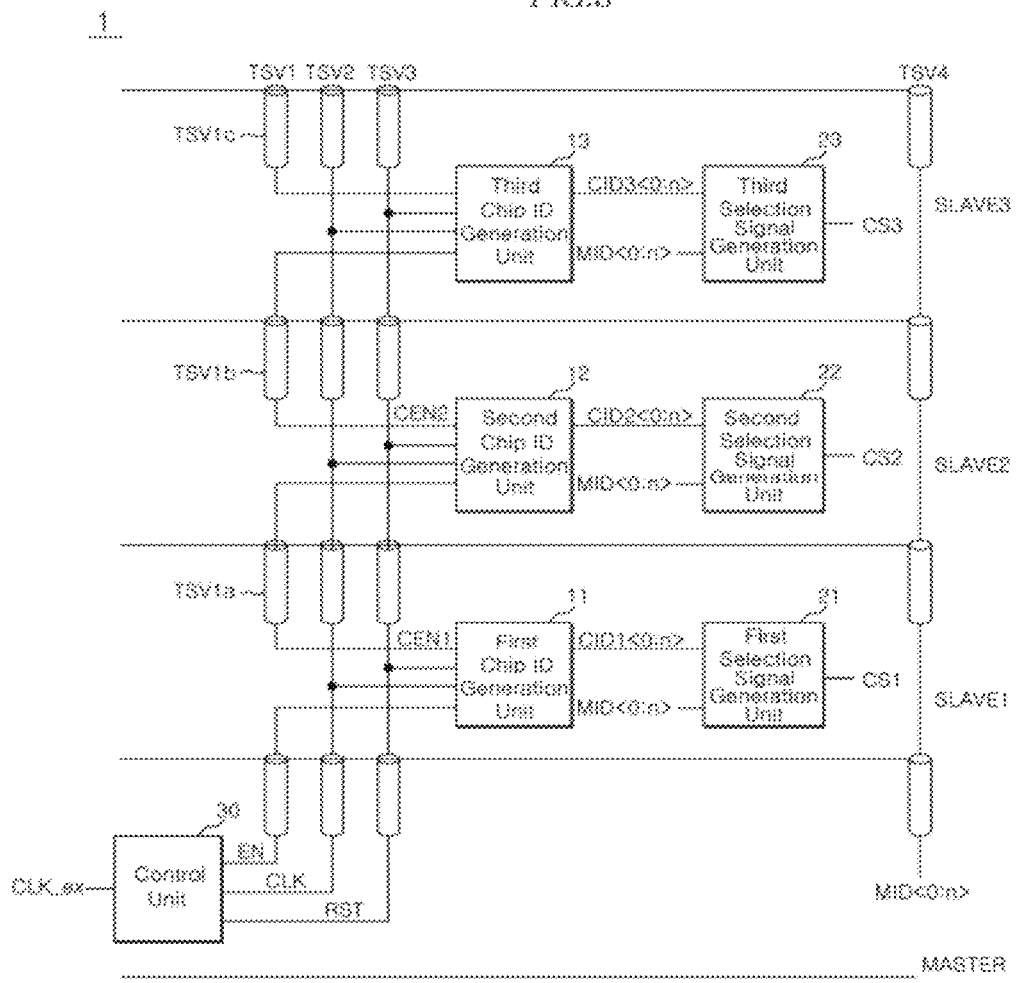
FIG. 3 is a view schematically illustrating the structure of a semiconductor apparatus in accordance with an exemplary embodiment of the present invention.

FIG. 3 is a view schematically illustrating the structure of a semiconductor apparatus in accordance with an exemplary embodiment of the present invention. In FIG. 3, although the semiconductor apparatus 1 is shown to be a 3D semiconductor apparatus which is formed from four stacked chips, it is to be noted that the number of stacked chips is not limited thereto. The semiconductor apparatus 1 may comprise a master chip MASTER, first to third chips SLAVE1 to SLAVE3, first to fourth TSVs (through-silicon vias) TSV1 to TSV4, first to third chip ID generation units 11 to 13, and first to third chip selection signal generation units 21 to 23.

The first to third TSVs TSV1 to TSV3 pass through the first to third chips SLAVE1 to SLAVE3, and electrically connect the first to third chips SLAVE1 to SLAVE3 each other. In the exemplary embodiment of the present invention, the second and third TSVs TSV2 and TSV3 are connected in parallel to the first to third chips SLAVE1 to SLAVE3, whereas the first TSV TSV1, which is comprised of three sub-TSVs TSV1a-TSV1c, sequentially connects in series the first to third chips SLAVE1 to SLAVE3. The first TSV TSV1 transmits an enable signal EN which is inputted from the master chip MASTER. The second TSV TSV2 transmits a clock signal CLK which is inputted from the master chip MASTER, to the first to third chips SLAVE1 to SLAVE3. The third TSV TSV3 transmits a reset signal RST which is inputted from the master chip MASTER to the first to third chips SLAVE1 to SLAVE3.

The first chip ID generation unit 11 is disposed in the first chip SLAVE1, and is configured to receive the enable signal EN through the first TSV TSV1 and the clock signal CLK through the second TSV TSV2 and generate a first converted enable signal CEN1 and a first chip ID signal CID1<0:n>. Also, the first chip ID generation unit 11 may be initialized by receiving the reset signal RST through the third TSV TSV3. The first converted enable signal CEN1 is transmitted to the second chip ID generation unit 12 through the first TSV TSV1 which connects in series the first and second chips SLAVE1 and SLAVE2.

The second chip ID generation unit 12 is disposed in the second chip SLAVE2, and is configured to receive the first converted enable signal CEN1 through the first TSV TSV1 and the clock signal CLK through the second TSV TSV2 and generate a second converted enable signal CEN2 and a second chip ID signal CID2<0:n>. Also, the second chip ID generation unit 12 may be initialized by receiving the reset signal RST through the third TSV TSV3. The second converted enable signal CEN2 is transmitted to the third chip ID generation unit 13 through the first TSV TSV1 which connects in series the second and third chips SLAVE2 and SLAVE3.

The third chip ID generation unit 13 is disposed in the third chip SLAVE3, and is configured to receive the second converted enable signal CEN2 through the first TSV TSV1 and the clock signal CLK through the second TSV TSV2 and generate a third chip ID signal CID3<0:n>. Also, the third chip ID generation unit 13 may be initialized by receiving the reset signal RST through the third TSV TSV3.

As described above, the three sub-TSVs TSV1a-TSV1c of the first TSV TSV1 connect in series the first to third chips SLAVE1 to SLAVE3. When the area where the three sub-TSVs TSV1a-TSV1c of the first TSV TSV1 are located is divided into a first chip region, a second chip region, and a third chip region, the first sub-TSV TSV1a of the first TSV in the first chip region is connected with the second chip ID generation unit 12, and the second chip ID generation unit 12 is connected with the second sub-TSV TSV1b in the second chip region. The second sub-TSV TSV1b of the first TSV in the second chip region is connected with the third chip ID generation unit 13, and the third chip ID generation unit 13 is connected with the third sub-TSV TSV1c in the third chip region. Accordingly, the three sub-TSVs TSV1a-TSV1c of the first TSV TSV1 electrically pass through the first to third chips SLAVE1 to SLAVE3 along one vertical line in the semiconductor apparatus 1 shown in FIG. 3, and connect in series, not in parallel, the first to third chips SLAVE1 to SLAVE3. The serial connections of the sub-TSVs TSV1a-

TSV1c of the first TSV TSV1 may be formed by redistribution layers which will be described later.

The first chip selection signal generation unit 21 is disposed in the first chip SLAVE1, and is configured to receive the first chip ID signal CID1<0:n> and a main ID signal MID<0:n> and generate a first chip selection signal CS1. The first chip selection signal generation unit 21 compares the first chip ID signal CID1<0:n> with the main ID signal MID<0:n>, and generates the first chip selection signal CS1 when the first chip ID signal CID1<0:n> matches the main ID signal MID<0:n>.

The second chip selection signal generation unit 22 is disposed in the second chip SLAVE2, and is configured to receive the second chip ID signal CID2<0:n> and the main ID signal MID<0:n> and generate a second chip selection signal CS2. The second chip selection signal generation unit 22 compares the second chip ID signal CID2<0:n> with the main ID signal MID<0:n>, and generates the second chip selection signal CS2 when the second chip ID signal CID2<0:n> matches the main ID signal MID<0:n>.

Similarly, the third chip selection signal generation unit 23 is disposed in the third chip SLAVE3, and is configured to receive the third chip ID signal CID3<0:n> and the main ID signal MID<0:n> and generate a third chip selection signal CS3. The third chip selection signal generation unit 23 compares the third chip ID signal CID3<0:n> with the main ID signal MID<0:n>, and generates the third chip selection signal CS3 when the third chip ID signal CID3<0:n> matches the main ID signal MID<0:n>.

The first to third chip selection signals CS1 to CS3 select a chip to operate among the first to third chips SLAVE1 to SLAVE3. For example, if the first chip selection signal CS1 is generated, the first chip SLAVE1 is activated and can perform various operations of the first semiconductor apparatus 1.

The main ID signal MID<0:n> is a signal which can be transmitted from a controller outside the semiconductor apparatus 1. The main ID signal MID<0:n> may be transmitted through the fourth TSVs TSV4 which connect in parallel the first to third chips SLAVE1 to SLAVE3 to the first to third chip selection signal generation units 21 to 23 which are respectively disposed in the first to third chips SLAVE1 to SLAVE3.

As shown in FIG. 3, the semiconductor apparatus 1 may further include a control unit 30 which is disposed in the master chip MASTER and is configured to generate the enable signal EN, the clock signal CLK, and the reset signal RST. The control unit 30 generates the enable signal EN in the form of a pulse signal upon the activation of the semiconductor apparatus 1. The enable signal EN may be generated, for example, from a power-up signal or a clock enable signal which is used to activate the semiconductor apparatus 1, although the scope of the present invention is not limited to the particular implementation. The control unit 30 may output the enable signal EN through the first TSV TSV1.

The control unit 30 may receive an external clock CLK_ex and generate the clock signal CLK. In the exemplary embodiment of the present invention, the clock signal CLK may have a cycle longer than the external clock CLK_ex. This is because it is possible to more precisely generate chip ID signals when generating the first to third chip ID signals CID1<0:n>, CID2<0:n> and CID3<0:n> by using the clock signal CLK with a cycle longer than that of the external clock CLK_ex than when generating the first to third chip ID signals CID1<0:n>, CID2<0:n> and CID3<0:n> by using the external clock CLK_ex with a short cycle. In particular, because the operation of generating the chip ID signals does not directly affect the performance of a semiconductor apparatus, as in a data input/output operation for example, the chip ID signals may be generated by using the clock signal CLK with a cycle longer than that of the external clock CLK_ex. The control unit 30 outputs the clock signal CLK through the second TSV TSV2.

Further, the control unit 30 may generate the reset signal RST and output the reset signal RST through the third TSV TSV3.

Figure 4:
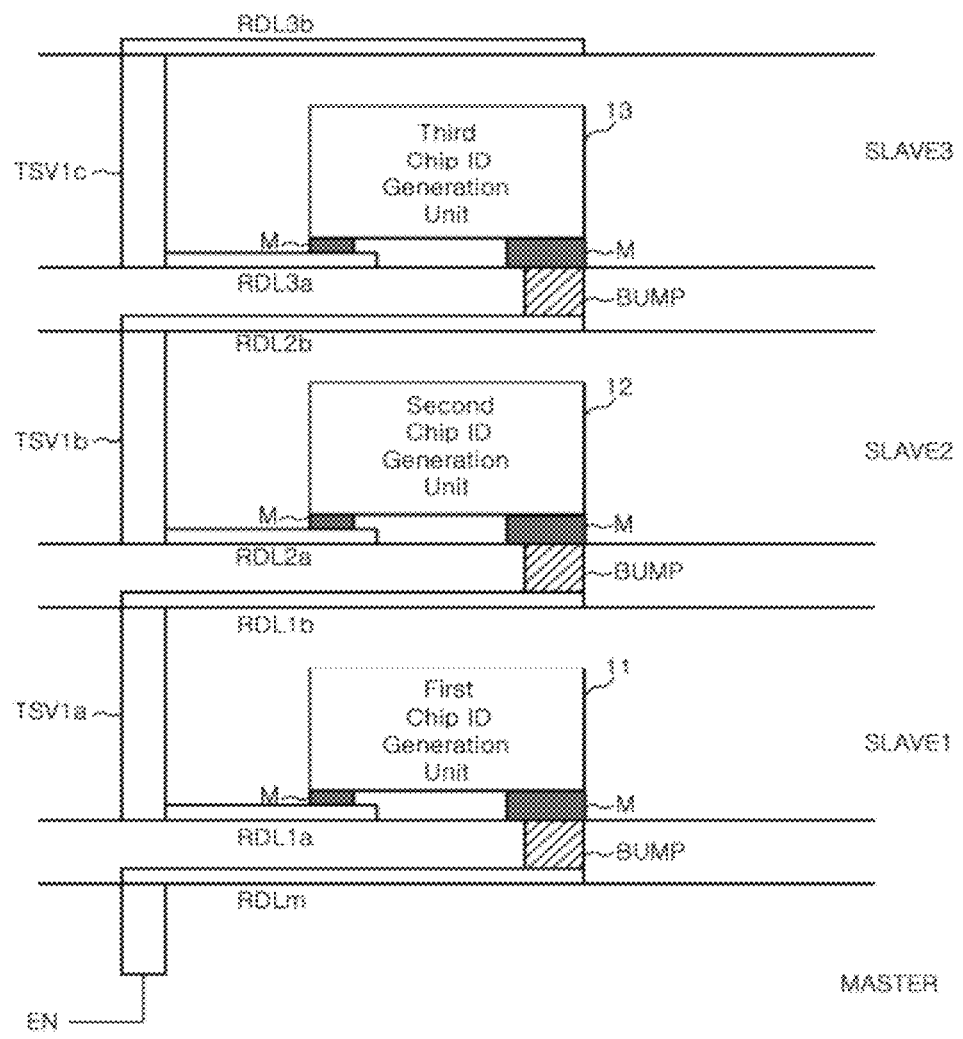
FIG. 4 is a view illustrating first TSVs which are connected in series through first to third chips.

FIG. 4 schematically illustrates that the three sub-TSVs TSV1a-TSV1c of the first TSVs TSV1 shown in FIG. 3 are connected in series through the first to third chips SLAVE1 to SLAVE3. In FIG. 4, the sub-TSVs TSV1a-TSV1c of the first TSV TSV1 are positioned along one straight vertical line passing through the first to third chips SLAVE1 to SLAVE3. The first to third chips SLAVE1 to SLAVE3 may include redistribution layers RDL1a, RDL1b, RDL2a, RDL2b, RDL3a, and RDL3b for serial connection of the sub-TSVs TSV1a-TSV1c of the first TSV TSV1. The first chip ID generation unit 11 of the first chip SLAVE1 receives the enable signal EN transmitted through the first TSV TSV1, through a redistribution layer RDLm which is disposed in the master chip MASTER. The first chip SLAVE1 includes first and second redistribution layers RDL1a and RDL1b. The first redistribution layer RDL1a extends rightward from the first sub-TSV TSV1a of the first TSV in the first chip region and electrically connects the first sub-TSV TSV1a of the first TSV with the first chip ID generation unit 11. The second redistribution layer RDL1b extends rightward from the first sub-TSV TSV1a of the first TSV and electrically connects the first sub-TSV TSV1a with the second chip ID generation unit 12. Accordingly, the enable signal EN transmitted from the master chip MASTER is inputted to the first chip ID generation unit 11, and the first converted enable signal CEN1 generated from the first chip ID generation unit 11 is transmitted to the first sub-TSV TSV1a in the first chip region through the first redistribution layer RDL1a. Furthermore, the transmitted first converted enable signal CEN1 is transmitted to the second redistribution layer RDL1b through the first sub-TSV TSV1a. The second redistribution layer RDL1b transmits the first converted enable signal CEN1 to the second chip ID generation unit 12, and the second converted enable signal CEN2 generated from the second chip ID generation unit 12 is transmitted to the second sub-TSV TSV1b of the first TSV in the second chip region through the redistribution layer RDL2a. The transmitted second converted enable signal CEN2 is transmitted to the third chip ID generation unit 13 through the second sub-TSV TSV1b of the first TSV in the second chip region and the redistribution layer RDL2b. As illustrated above, the first to third chips SLAVE1 to SLAVE3 include the redistribution layers allowing sequential serial connection of the first chip ID generation unit 11, the first sub-TSV TSV1a in the first chip region, the second chip ID generation unit 12, the second sub-TSV TSV1b in the second chip region and the third chip ID generation unit 13. Hence, the first TSV TSV1, which comprises the first to third sub-TSVs TSV1a-TSV1c, can connect in series the first to third chips SLAVE1 to SLAVE3.

In FIG. 4, at least one metal line M may be interposed between the redistribution layer RDL1a, which electrically connects the first chip ID generation unit 11 with the first sub-TSV TSV1a in the first chip region, and the first chip ID generation unit 11. Also, a bump BUMP and at least one metal line M may be interposed between the redistribution layer RDL1b, which electrically connects the first sub-TSV TSV1a in the first chip region with the second chip ID generation unit 12, and the second chip ID generation unit 12. Similarly, the redistribution layers RDL2a, RDL2b, RDL3a and RDL3b disposed in the second and third chips SLAVE2 and SLAVE3 and the component elements connected thereto may include metal lines M and bumps BUMP.

As shown in FIG. 4, by disposing the redistribution layers in the respective chips, the TSVs disposed along one vertical line can sequentially connect the chips in series. Also, the serial connection of the TSVs is made possible while the first to third chips SLAVE1 to SLAVE3 have the same structure.

Figure 5:
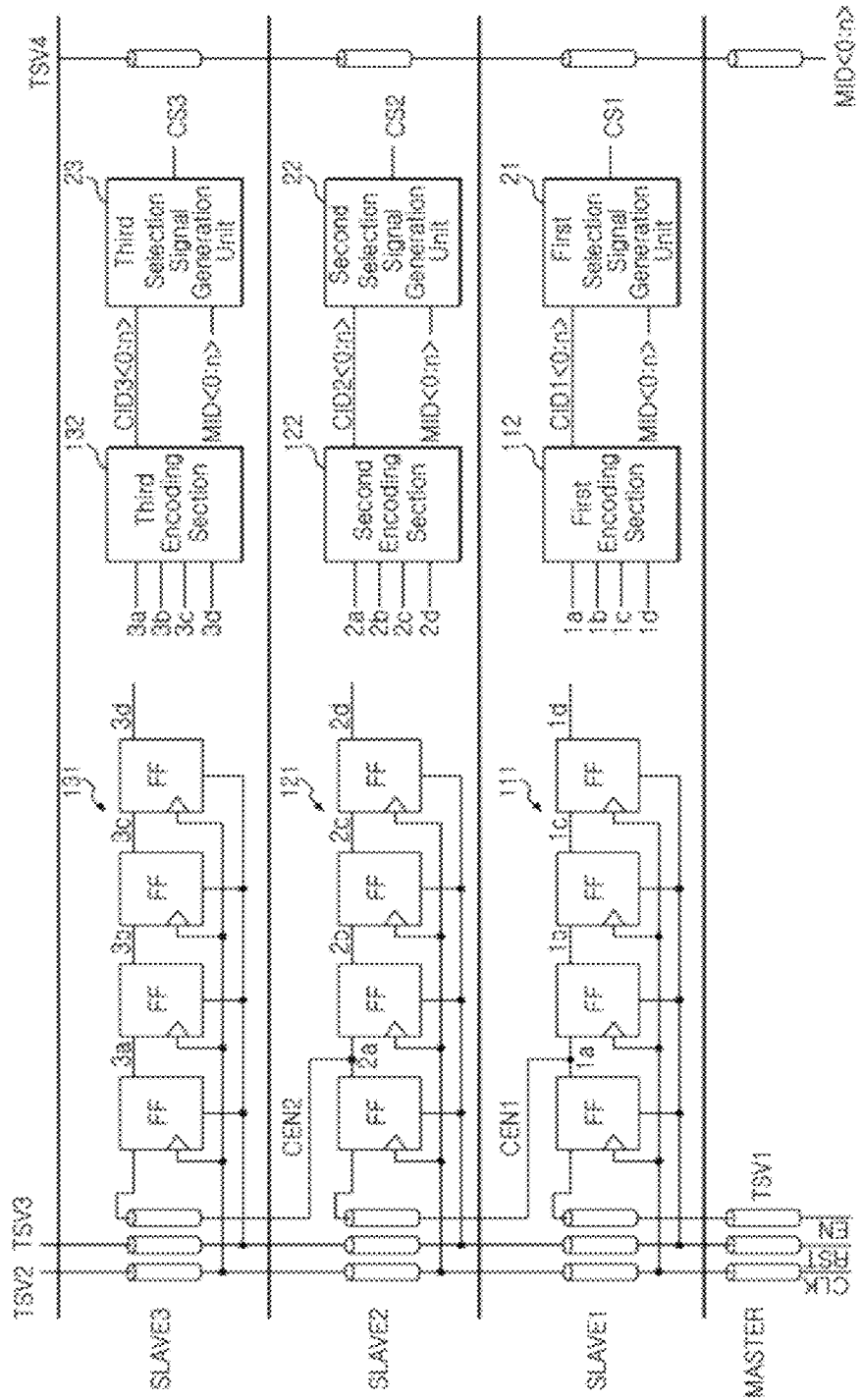
FIG. 5 is a view illustrating the detailed configuration of the semiconductor apparatus shown in FIG. 3.

FIG. 5 is a view illustrating an exemplary configuration of the semiconductor apparatus 1 shown in FIG. 3. As shown in FIG. 5, the first chip ID generation unit 11 may comprise a first code signal generation section 111 and a first encoding section 112. The first code signal generation section 111 is configured to receive the enable signal EN, the clock signal CLK, and the reset signal RST through the first to third TSVs TSV1 to TSV3 and generate the first converted enable signal CEN1 and first code signals 1a, 1b, 1c and 1d. In FIG. 5, the first code signal generation section 111 may include four flip-flops FF. The four flip-flops FF perform operations of storing and outputting the enable signal EN when the clock signal CLK is inputted. Accordingly, the enable signal EN transmitted through the first TSV TSV1 is inputted to the flip-flops FF. The enable signal EN is sequentially delayed by the four flip-flops FF. For example, when the enable signal EN is applied as a high level pulse and the clock signal CLK toggles four times, the first code signals 1a, 1b, 1c and 1d may have logic levels of 0001. The first flip-flop FF among the four flip-flops FF delays the enable signal EN and generates the first converted enable signal CEN1. The first converted enable signal CEN1 is inputted through the first TSV TSV1 to the second chip ID generation unit 12. The first encoding section 112 is configured to receive the first code signals 1a, 1b, 1c and 1d and generate the first chip ID signal CID1<0:n>. The first encoding section 112 encodes the first code signals 1a, 1b, 1c and 1d to a predetermined bit number n and generates the first chip ID signal CID1<0:n>.

Similarly to the first chip ID generation unit 11, a second code signal generation section 121 of the second chip ID generation unit 12 may also include four flip-flops FF and generate second code signals 2a, 2b, 2c and 2d. Since a first flip-flop FF of the second code signal generation section 121 receives the first converted enable signal CEN1 which is generated by delaying the enable signal EN, the second code signals 2a, 2b, 2c and 2d may have logic levels of 0010 when the clock signal CLK toggles four times. The first flip-flop FF of the second code signal generation section 121 delays the first converted enable signal CEN1 and generates the second converted enable signal CEN2. The second converted enable signal CEN2 is inputted through the first TSV TSV1 to the third chip ID generation unit 13. A second encoding section 122 is configured to receive the second code signals 2a, 2b, 2c and 2d and generate the second chip ID signal CID2<0:n>. The second encoding section 122 encodes the second code signals 2a, 2b, 2c and 2d to a predetermined bit number n and generates the second chip ID signal CID2<0:n>.

A third code signal generation section 131 of the third chip ID generation unit 13 may also include four flip-flops FF and generates third code signals 3a, 3b, 3c and 3d. Since the first flip-flop FF of the third code signal generation section 131 receives the second converted enable signal CEN2 which is generated by delaying the first converted enable signal CEN1, the third code signals 3a, 3b, 3c and 3d may have logic levels of 0100 when the clock signal CLK toggles four times. A third encoding section 132 is configured to receive the third code signals 3a, 3b, 3c and 3d and generate the third chip ID signal CID3<0:n>. The third encoding section 132 encodes the third code signals 3a, 3b, 3c and 3d to a predetermined bit number n and generates the third chip ID signal CID3<0:n>.

The number of flip-flops constituting each of the code signal generation sections 111, 121 and 131 is not specifically limited to that used in the exemplary embodiment of the present invention. A person skilled in the art will readily appreciate that the number of flip-flops may vary depending upon the number of stacked chips comprising the semiconductor apparatus 1 and the toggling number of the clock signal CLK may vary as well.

The first to third chip selection signal generation units 21 to 23 receive the main ID signal MID<0:n> through the fourth TSVs TSV4. Each of the first to third chip selection signal generation units 21 to 23 is configured to compare the main ID signal MID<0:n> with the respective chip ID signals CID1<0:n>, CID2<0:n> and CID3<0:n> and generate one of the first to third chip selection signals CS1 to CS3 based on a comparison result. When any of the chip ID signals CID1<0:n>, CID2<0:n> and CID3<0:n> matches the main ID signal MID<0:n>, the corresponding one of the first to third chip selection signal generation units 21 to 23 generates the chip selection signal which has the corresponding chip ID signal. For example, if the main ID signal MID<0:n> matches the second chip ID signal CID2<0:n>, the second chip selection signal generation unit 22 generates the second chip selection signal CS2. The first to third chip selection signal generation units 21 to 23 may be configured to include exclusive NOR gates which receive the main ID signal MID<0:n> and the respective chip ID signals CID1<0:n>, CID2<0:n> and CID3<0:n>.

Operations of the semiconductor apparatus 1 in accordance with an exemplary embodiment of the present invention will be described below with reference to FIGS. 3 and 5. If the semiconductor apparatus 1 is activated, the control unit 30 disposed in the master chip MASTER generates the enable signal EN and generates the clock signal CLK from the external clock CLK_ex. The enable signal EN is transmitted through the first TSV TSV1 to the first code signal generation section 111 of the first chip ID generation unit 11, and the clock signal CLK is transmitted to the first to third code signal generation sections 111, 121 and 131 of the first to third chips SLAVE1 to SLAVE3 through the second TSV TSV2.

If the enable signal EN is a high level pulse signal and the clock signal CLK toggles four times, the first code signal generation section 111 generates the first code signals 1a, 1b, 1c and 1d of 0001, the second code signal generation section 121 generates the second code signals 2a, 2b, 2c and 2d of 0010, and the third code signal generation section 131 generates the third code signals 3a, 3b, 3c and 3d of 0100. The first to third encoding sections 112, 122 and 132 encode the respective code signals and generate the first to third chip ID signals CID1<0:n>, CID2<0:n> and CID3<0:n>.

Each of the first to third chip selection signal generation units 21 to 23 receives the respective chip ID signals CID1<0:n>, CID2<0:n> and CID3<0:n> and the main ID signal MID<0:n> which is transmitted from the master chip MASTER through the fourth TSVs TSV4, and compares the respective chip ID signals CID1<0:n>, CID2<0:n> and CID3<0:n> with the main ID signal MID<0:n>. If the main ID signal MID<0:n> matches the second chip ID signal CID2<0:n>, the second chip selection signal generation unit 22 generates the second chip selection signal CS2, and the first and third chip selection signal generation units 21 and 23 do not generate the first and third chip selection signals CS1 and CS3. Accordingly, the second chip SLAVE2 is activated in response to the second chip selection signal CS2, and the second chip SLAVE2 can perform the operations of the semiconductor apparatus 1.

The semiconductor apparatus 1 can realize serial connection of the TSVs and the respective chips, and can quickly and simply apply the chip ID signals. Accordingly, a chip which is required to operate can be individually selected and activated.

Figure 6:
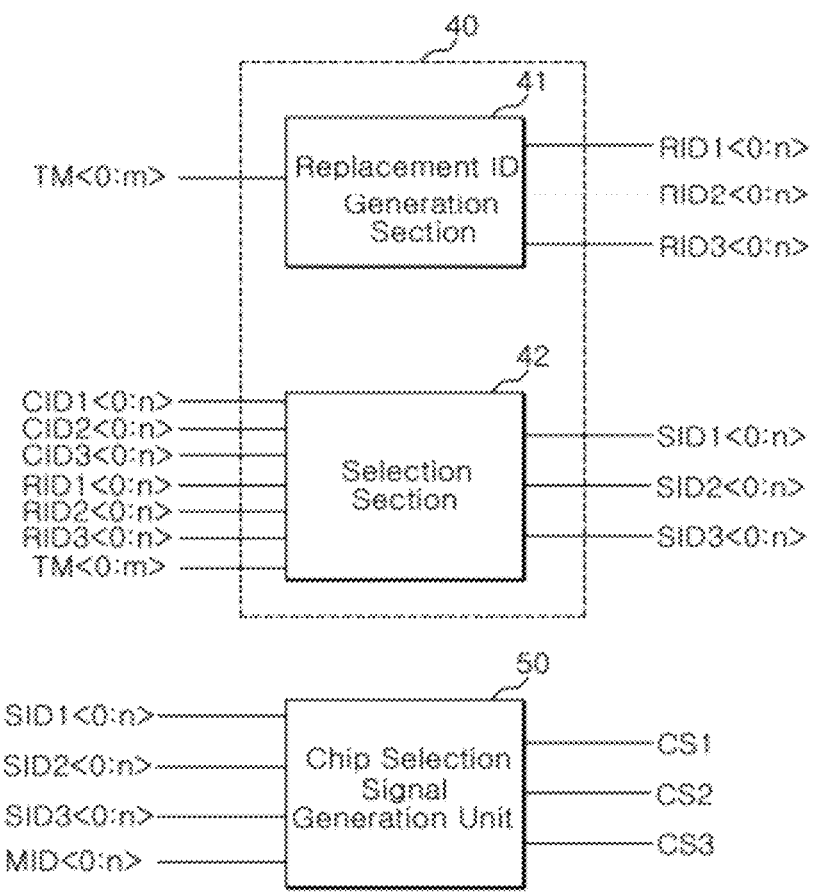
FIG. 6 is a diagram illustrating configurations to be added and provided as a replacement to the semiconductor apparatus shown in FIG. 3.

FIG. 6 illustrates an additional configuration of the semiconductor apparatus 1 in accordance with an exemplary embodiment of the present invention. FIG. 6 illustrates a selection ID generation unit 40 which may be added and a chip selection signal generation unit 50 which may replace the chip selection signal generation units 21 to 23 shown in FIG. 3. The selection ID generation unit 40 receives a test mode signal TM<0:m> and first to third chip ID signals CID1<0:n>, CID2<0:n> and CID3<0:n>. The selection ID generation unit 40 generates first to third replacement ID signals RID1<0:n>, RID2<0:n> and RID3<0:n> from the test mode signal TM<0:m>. The first replacement ID signal RID1<0:n> is a signal for replacing the first chip ID signal CID1<0:n>, the second replacement ID signal RID2<0:n> is a signal for replacing the second chip ID signal CID2<0:n>, and the third replacement ID signal RID3<0:n> is a signal for replacing the third chip ID signal CID3<0:n>. The selection ID generation unit 40 is configured to output either the first to third chip ID signals CID1<0:n>, CID2<0:n> and CID3<0:n> or the first to third replacement ID signals RID1<0:n>, RID2<0:n> and RID3<0:n> as the selection ID signals SID1<0:n>, SID2<0:n> and SID3<0:n> in response to the test mode signal TM<0:m>. When any one of the first to third chip ID signals CID1<0:n>, CID2<0:n> or CID3<0:n> is not properly generated, the selection ID generation unit 40 outputs the first to third replacement ID signals RID1<0:n>, RID2<0:n> and RID3<0:n> instead of the first to third chip ID signals CID1<0:n>, CID2<0:n> and CID3<0:n> as the first to third selection ID signals SID1<0:n>, SID2<0:n> and SID3<0:n>, thereby ensuring a precise chip selection operation of the semiconductor apparatus 1.

The selection ID generation unit 40 includes a replacement ID generation section 41 and a selection section 42. The replacement ID generation section 41 is configured to receive the test mode signal TM<0:m> and generate the first to third replacement ID signals RID1<0:n>, RID2<0:n> and RID3<0:n>. The replacement ID generation section 41 includes a plurality of fuse sets (not shown). Accordingly, by cutting the fuses owned by the plurality of fuse sets in a desired way and applying the test mode signal TM<0:m>, the first to third replacement ID signals RID1<0:n>, RID2<0:n> and RID3<0:n> are generated.

The selection section 42 is configured to output either the first to third chip ID signals CID1<0:n>, CID2<0:n> and CID3<0:n> or the first to third replacement ID signals RID1<0:n>, RID2<0:n> and RID3<0:n>. That is to say, the selection section 42 generates either the first chip ID signal CID1<0:n> or the first replacement ID signal RID1<0:n> as the first selection ID signal SID1<0:n>, either the second chip ID signal CID2<0:n> or the second replacement ID signal RID2<0:n> as the second selection ID signal SID2<0:n>, and either the third chip ID signal CID3<0:n> or the third replacement ID signal RID3<0:n> as the third selection ID signal SID3<0:n>.

While not shown separately, the selection ID generation unit 40 may be distributed and disposed in the first to third chips SLAVE1 to SLAVE3, as with the first to third chip ID generation units 11 to 13. Also, the selection ID generation unit 40 may be collectively disposed in the master chip MASTER. In this case, additional TSVs for transmitting the respective ID signals may be needed.

The chip selection signal generation unit 50 is configured to receive the first to third selection ID signals SID1<0:n>, SID2<0:n> and SID3<0:n> and the main ID signal MID<0:n> and generate the first to third chip selection signals CS1 to CS3. The chip selection signal generation unit 50 compares the first to third selection ID signals SID1<0:n>, SID2<0:n> and SID3<0:n> with the main ID signal MID<0:n> and generates a chip selection signal which corresponds to a selection ID signal matching the main ID signal MID<0:n>. For example, if the main ID signal MIS<0:n> matches the second selection ID signal SID2<0:n>, the chip selection signal generation unit 50 generates the second chip selection signal CS2 and does not generate the first and third chip selection signals CS1 and CS3. While not shown separately, the chip selection signal generation unit 50 may be distributed and disposed in the first to third chips SLAVE1 to SLAVE3 as with the first to third chip selection signal generation units 21 to 23. Through additional and replacement configurations, the semiconductor apparatus 1 in accordance with an exemplary embodiment of the present invention may generate the chip selection signals more precisely.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
 a first chip ID generation unit configured to receive an enable signal through a first through-silicon via and a clock signal through a second through-silicon via and generate a first chip ID signal and a delayed enable signal;
 a second chip ID generation unit configured to receive the delayed enable signal through a third through-silicon via from the first chip ID generation unit and the clock signal and generate a second chip ID signal;
 a first chip selection signal generation unit configured to receive the first chip ID signal and a main ID signal and generate a first chip selection signal; and
 is a second chip selection signal generation unit configured to receive the second chip ID signal and the main ID signal and generate a second chip selection signal.

2. The semiconductor apparatus according to claim 1, further comprising a master chip which includes a controller that transmits the enable signal, the clock signal, and the main ID signal, and the clock signal is generated based on an external clock.

3. The semiconductor apparatus according to claim 2, wherein the clock signal has a cycle longer than that of the external clock.

4. The semiconductor apparatus according to claim 1, wherein the first chip ID generation unit comprises:
 a first code signal generation section configured to receive the enable signal through the first through-silicon via and generate the delayed enable signal and first code signals; and
 a first encoding section configured to encode the first code signals and generate the first chip ID signal.

5. The semiconductor apparatus according to claim 4, wherein the second chip ID generation unit comprises:

a second code signal generation section configured to receive the delayed enable signal through the third through-silicon via and generate second code signals; and a second encoding section configured to encode the second code signals and generate the second chip ID signal.

6. The semiconductor apparatus according to claim 1, wherein the clock signal is transmitted to the second chip ID generation unit through second through-silicon via.

7. The semiconductor apparatus according to claim 6, wherein the second and fourth through-silicon vias are connected in parallel.

8. The semiconductor apparatus according to claim 7, wherein the first and third through-silicon vias are formed in align with a straight line.

9. The semiconductor apparatus according to claim 1, further comprising:
a first redistribution layer configured to electrically connect the first chip ID generation unit and the first through-silicon via in a first chip region; and
a second redistribution layer configured to electrically connect the first through-silicon via in the first chip region and the second chip ID generation unit.

10. The semiconductor apparatus according to claim 9, further comprising:
a metal line configured to electrically connect the first chip ID generation unit and the first redistribution layer.

11. The semiconductor apparatus according to claim 9, further comprising:
a metal line and a bump configured to electrically connect the second redistribution layer and the second chip ID generation unit.

12. A semiconductor apparatus comprising:
a first chip ID generation unit configured to receive an enable signal through a first through-silicon via and a clock signal and generate a first chip ID signal and a converted enable signal;
a second chip ID generation unit configured to receive the converted enable signal through a second through-silicon via and the clock signal to generate a second chip ID signal;
a selection ID generation unit configured to provide one of the first chip ID signal and a first replacement ID signal as a first selection ID signal and provide one of the second chip ID signal and a second replacement ID signal as a second selection ID signal; and
a chip selection signal generation unit configured to receive the first and second selection ID signals and a main ID signal and generate first and second chip selection signals.

13. The semiconductor apparatus according to claim 12, wherein the enable signal, the clock signal, and the main ID signal are transmitted from a master chip.

14. The semiconductor apparatus according to claim 12, further comprising:
a control unit configured to generate the enable signal upon activation of the semiconductor apparatus and generate the clock signal in response to an external clock.

15. The semiconductor apparatus according to claim 14, wherein the clock signal has a cycle longer than that of the external clock.

16. The semiconductor apparatus according to claim 12, wherein the selection ID generation unit comprises:
a replacement ID generation section configured to generate the first and second replacement ID signals in response to a test mode signal; and a selection section configured to provide one of the first chip ID signal and the replacement ID signal as the first selection ID signal and provide one of the second chip ID signal and the replacement ID signal as the second selection ID signal, in response to the test mode signal.

17. The semiconductor apparatus according to claim 12, wherein the first chip ID generation unit comprises:
a first code signal generation section configured to receive the enable signal through the first through-silicon via and the clock signal to generate the converted enable signal and first code signals; and
a first encoding section configured to encode the first code signals and generate the first chip ID signal.

18. The semiconductor apparatus according to claim 17, wherein the second chip ID generation unit comprises:
a second code signal generation section configured to receive the converted enable signal through the second through-silicon via and the clock signal to generate second code signals; and
a second encoding section configured to encode the second code signals and generate the second chip ID signal.

19. The semiconductor apparatus according to claim 12, further comprising:
a first redistribution layer configured to electrically connect the first chip ID generation unit and the first through-silicon via in a first chip region; and
a second redistribution layer configured to electrically connect the first through-silicon via in the first chip region and the second chip ID generation unit.

20. The semiconductor apparatus according to claim 19, further comprising:
a metal line configured to electrically connect the first chip ID generation unit and the first redistribution layer.

21. The semiconductor apparatus according to claim 19, further comprising:
a metal line and a bump configured to electrically connect the second redistribution layer and the second chip ID generation unit.

22. A semiconductor apparatus including first and second chips stacked, comprising:
a first set of through-silicon vias configured to pass through and connect the first and second chips while extending along one straight line, and transmit a signal generated from a circuit disposed in the first chip;
a first redistribution layer configured to electrically connect the first set of through-silicon vias and a circuit disposed in the second chip; and
a second redistribution layer configured to electrically connect the circuit disposed in the second chip and the first set of through-silicon vias.

23. The semiconductor apparatus according to claim 22, further comprising:
another redistribution layer configured to electrically connect the circuit disposed in the first chip and the first through-silicon via.

24. The semiconductor apparatus according to claim 23, further comprising:
a metal line configured to electrically connect the circuit disposed in the first chip and another redistribution layer.

25. The semiconductor apparatus according to claim 22, further comprising:
a bump and a metal line configured to electrically connect the first redistribution layer and the circuit disposed in the second chip.

26. The semiconductor apparatus according to claim 22, further comprising:

a metal line configured to electrically connect the circuit disposed in the second chip and the second redistribution layer.

27. A semiconductor apparatus with a plurality of chips, comprising:
- a first circuit module configured to receive a chip enable signal and a clock signal and generate a first identification signal indicative of a first code representing a first chip of the plurality of chips and a delayed enable signal, the delayed enable signal being obtained by delaying the enable signal based on the clock signal;
- a second circuit module configured to receive the delayed enable signal from the first circuit module and the clock signal and generate a second identification signal indicative of a second code representing a second chip of the plurality of chips;
- a first chip designation module configured to receive the first identification signal and a chip designation signal indicative of a target code representing a target chip to be activated among the plurality of chips including the first and second chips, and compare the first code with the target code to generate a first chip selection signal based thereon; and
- a second chip designation module configured to receive the second identification signal indicative of a second code representing the second chip and the chip designation signal, and compare the second code with the target code to generate a second chip selection signal based thereon.

28. The semiconductor apparatus according to claim 27, wherein the enable signal, the clock signal, and the chip designation signal are transmitted from a master chip among the plurality of chips.

29. The semiconductor apparatus according to claim 27, further comprising:
- a control unit configured to generate the enable signal when the semiconductor apparatus is activated and generate the clock signal in response to an external clock.

30. The semiconductor apparatus according to claim 29, wherein the clock signal has a cycle longer than that of the external clock.

31. The semiconductor apparatus according to claim 27, wherein the enable signal is transmitted to the first circuit module through a first through-silicon via and the clock signal is transmitted to the first circuit module through a second through-silicon via.

32. The semiconductor apparatus according to claim 31, wherein the delayed enable signal is transmitted to the second circuit module through a third through-silicon via and the clock signal is transmitted to the second circuit module through a fourth through-silicon via.

33. The semiconductor apparatus according to claim 32, wherein the second and fourth through-silicon vias are in direct electrical contact with each other.

34. The semiconductor apparatus according to claim 33, wherein the first and third through-silicon vias are formed in align with a straight line.

* * * * *